US010790660B2

(12) United States Patent
Igl et al.

(10) Patent No.: US 10,790,660 B2
(45) Date of Patent: Sep. 29, 2020

(54) OVERVOLTAGE PROTECTION ARRANGEMENT FOR INFORMATION AND TELECOMMUNICATION TECHNOLOGY

(71) Applicant: DEHN + SÖHNE GMBH + CO. KG, Neumarkt/Opf. (DE)

(72) Inventors: Peter Igl, Pyrbaum (DE); Julius Maria Schrafl, Neumarkt (DE)

(73) Assignee: DEHN SE + CO KG, Neumarkt/Opf. (DE)

( * ) Notice: Subject to any disclaimer, the term of this patent is extended or adjusted under 35 U.S.C. 154(b) by 552 days.

(21) Appl. No.: 15/540,126

(22) PCT Filed: Dec. 2, 2015

(86) PCT No.: PCT/EP2015/078265
§ 371 (c)(1),
(2) Date: Jun. 27, 2017

(87) PCT Pub. No.: WO2016/107713
PCT Pub. Date: Jul. 7, 2016

(65) Prior Publication Data
US 2017/0366000 A1 Dec. 21, 2017

(30) Foreign Application Priority Data

Dec. 29, 2014 (DE) .......................... 10 2014 019 560
Jul. 24, 2015 (DE) .......................... 10 2015 009 564

(51) Int. Cl.
*H02H 3/20* (2006.01)
*H02H 9/04* (2006.01)
(Continued)

(52) U.S. Cl.
CPC ............... *H02H 9/044* (2013.01); *H01R 9/26* (2013.01); *H01T 4/04* (2013.01); *H01T 4/06* (2013.01);
(Continued)

(58) Field of Classification Search
CPC .... H05K 5/0247; H05K 5/0026; H05K 1/144; H02H 9/044; H02H 9/045
(Continued)

(56) References Cited

U.S. PATENT DOCUMENTS

| 4,922,374 A | 5/1990 | Mueller et al. ............... 361/119 |
| 7,411,769 B2 * | 8/2008 | Schimanski .............. H01T 4/06 |
| | | 335/6 |

(Continued)

FOREIGN PATENT DOCUMENTS

| DE | 10 2006 034164 | 11/2007 | ............... H01R 9/26 |
| DE | 20 2011 000 835 | 11/2011 | ............. H01R 13/66 |
| KR | 101 277 321 | 6/2013 | ............... H01T 4/00 |

OTHER PUBLICATIONS

The Notification Concerning Transmittal of International Preliminary Report on Patentability (Chapter I of the Patent Cooperation Treaty), in English, dated Jul. 13, 2017, which was issued by the International Bureau of WIPO in Applicant's corresponding international PCT application having Serial No. PCT/EP2015/078265, filed on Dec. 2, 2015.

(Continued)

*Primary Examiner* — Jared Fureman
*Assistant Examiner* — Lucy M Thomas
(74) *Attorney, Agent, or Firm* — Bodner & O'Rourke, LLP; Gerald T. Bodner; Christian P. Bodner

(57) ABSTRACT

The invention relates to an overvoltage protection arrangement for information and telecommunication technology, consisting of a housing with means formed on the housing base for mounting top-hat rails, overvoltage protection elements which can be found in the housing, electric connection means, and at least one circuit board as a wiring support for the overvoltage protection elements. When viewed laterally, the housing is designed approximately in the shape of a T standing on its head and has a beam-shaped main part (Continued)

with a protruding head part, wherein the electric connection means can be accessed and actuated via the upper face of the beam-shaped main part. A first and second circuit board are located on a respective inner face of the lateral walls of the housing in a mutually spaced manner, and the electric connection means in the form of electric connection terminals, connection sockets, and/or plugs for example are arranged in the spacing between the first and second circuit board such that first connection means can be accessed on the horizontal plane of the beam-shaped main part and second connection means can be accessed on the vertical plane of the beam-shaped main part. The flat shape of the circuit board corresponds to the T shape of the housing or approximates the shape of the housing.

5 Claims, 8 Drawing Sheets

(51) Int. Cl.
    *H01T 4/04*         (2006.01)
    *H01T 4/06*         (2006.01)
    *H01R 9/26*         (2006.01)
    *H05K 1/14*         (2006.01)
    *H05K 5/00*         (2006.01)
    *H05K 5/02*         (2006.01)
    *H05K 1/18*         (2006.01)

(52) U.S. Cl.
    CPC ............. *H02H 9/045* (2013.01); *H05K 1/144* (2013.01); *H05K 5/0026* (2013.01); *H05K 5/0247* (2013.01); *H05K 1/181* (2013.01); *H05K 5/0021* (2013.01); *H05K 2201/042* (2013.01); *H05K 2201/09027* (2013.01); *H05K 2201/10287* (2013.01); *H05K 2201/10325* (2013.01); *H05K 2201/10393* (2013.01)

(58) Field of Classification Search
    USPC ........................................................ 361/91.1
    See application file for complete search history.

(56) References Cited

U.S. PATENT DOCUMENTS

| | | | |
|---|---|---|---|
| 2004/0171286 A1* | 9/2004 | Baker | H04Q 1/146 439/76.1 |
| 2004/0246644 A1 | 12/2004 | Sato et al. | 361/119 |
| 2014/0009858 A1* | 1/2014 | Suchy | H01T 1/12 361/91.1 |
| 2014/0065863 A1* | 3/2014 | Bodmann | H05K 7/1468 439/153 |

OTHER PUBLICATIONS

The English translation of the International Preliminary Report on Patentability (Chapter I of the Patent Cooperation Treaty), dated Jul. 4, 2017, which was issued by the International Bureau of WIPO in Applicant's corresponding international PCT application having Serial No. PCT/EP2015/078265, filed on Dec. 2, 2015.

The Written Opinion of the International Searching Authority, in English, dated Mar. Mar. 30, 2016, which was issued by the International Bureau of WIPO in Applicant's corresponding international PCT application having Serial No. PCT/EP2015/078265, filed on Dec. 2, 2015.

The International Search Report, in English, dated Mar. 30, 2016, which was issued by the International Bureau of WIPO in Applicant's corresponding international PCT application having Serial No. PCT/EP2015/078265, filed on Dec. 2, 2015.

* cited by examiner

OVERVOLTAGE PROTECTION ARRANGEMENT FOR INFORMATION AND TELECOMMUNICATION TECHNOLOGY

The invention relates to an overvoltage protection arrangement for information and telecommunication technology, consisting of a housing with means formed on the housing base for top-hat rail mounting, overvoltage protection elements located in the housing, electric connection means and at least one printed circuit board as a wiring support for the overvoltage protection elements, and further consisting of a housing with a beam-shaped main part and a protruding head part according to claim 1.

Overvoltage protection arrangements for information technology, e.g. as a divisable arrester for top-hat rail mounting, are known under the product designation Blitzductor, which is manufactured and offered by DEHN+ SÖHNE GmbH+Co. KG.

For the economic protection of multi-conductor signal paths, surge arresters are known in the prior art, which are located in a housing which permits top-hat rail mounting. In this case, the actual overvoltage protection elements, decoupling resistors, diodes, inductances, but also, if necessary, the triggering circuits, are located in the housing, which has the shape of an upside-down T. The connection on the input and output side are made via screw terminals, as for example with respect to the types Blitzductor BVT, which are accessible from the upper side of the beam-shaped main part of the housing.

DE 20 2011 000 835 U1 discloses a bus-capable, stackable connection and/or function module for controlling and/or monitoring technical processes or for building automation, which has a disk-like or block-like design. This prior art functional module can be fitted with further modules to form a connection system, and has at least one base clamp body and a housing which can be placed on said body. A circuit board and/or a punching grid are arranged in the housing, or in one embodiment a busbar arrangement. Moreover, at least one bus conductor contact is provided for conducting at least one energy or data bus in the stacking direction. In the housing according to DE 20 2011 000 835 U1, connection or function modules can be connected separately, wherein at least one of these function modules comprises signal matching electronics in addition to I/O electronics of the corresponding connection or function module. At least one of the stackable connection or function modules is intended to have a connection plane whose connections are connected to one another in a conducting manner in such a way that a series terminal function can be realised.

It has been recognised that in the known overvoltage protection arrangements for information and telecommunication technology, the connection of the devices to be protected via existing wire clamps represents a considerable expense, wherein the number of the wires to be connected often requires a plurality of screw terminals which can be integrated into a corresponding housing only with difficulty. In the case of the need for a through connection of a bus/communication line for the data exchange between several devices arranged side by side, it was necessary until now to provide a respective separate cable connection. When replacing the corresponding devices or for the purpose of measuring and testing processes, it is therefore necessary to loosen further terminals, resulting in more complicated handling.

It is therefore the object of the invention from the statements made above to provide a further developed overvoltage protection arrangement for the information and telecommunication technology, consisting of a housing with means formed on the housing base for top-hat rail mounting and of overvoltage protection elements disposed in the housing, together with electric connection means, which on the one hand provide an optimal installation space for the necessary electric and mechanical means and also offers new possibilities for contacting on the other hand, so that overall the handling and mounting effort is reduced when such overvoltage protection arrangements or devices are used.

The solution to the object of the invention is achieved with the feature combination according to claim 1, wherein the subclaims represent at least expedient embodiments and further developments.

An overvoltage protection arrangement for the information and telecommunication technology is therefore assumed. This includes all applications in the field of building technology, process engineering and electronic data transmission, without excluding other fields of application.

The overvoltage protection arrangement comprises a housing with means formed on the housing base for top-hat rail mounting.

In addition, the actual overvoltage protection elements, e.g. varistors, gas arresters, protective diodes, resistors or the like, are located in the housing. Electric connection means are provided on or in the housing, and at least one printed circuit board is provided as a wiring carrier for the overvoltage protection elements.

The housing has a side view for example which corresponds to the shape of an approximate, upside-down T. Modifications of this housing form lie within the meaning of the invention.

The housing has a substantially beam-shaped main part and a head part protruding from the main part, wherein the electric connection means can be accessed or actuated for example via the upper side or front side of the beam-shaped main part.

According to the invention, a first and a second printed circuit board, which are spaced from each other, are respectively formed on the inner sides of the side walls of the housing.

The resulting distance space between the circuit boards forms a spatial volume for the electric connection means in the form of electric connection terminals, connection sockets and/or connection plugs. First connection means are accessible in the horizontal plane of the beam-shaped main part and second connection means in the vertical plane thereof. Furthermore, the surface shape of the circuit boards corresponds to the shape of the housing or is approximated to this housing shape. As a result, the largest possible area resulting from the housing design is virtually utilised by the circuit boards.

The spaced-apart arrangement of the printed circuit boards makes it possible, with direct contact to the printed circuit boards, to fix and electrically contact both the required terminals for a wire connection as well as coaxial plug connectors.

In a preferred embodiment, the first connecting means are formed as lockable socket strips fixed on the printed circuit boards for clamping wires.

In a further embodiment, the second connection means are formed as coaxial plugs or sockets.

In a preferred development of the invention, the horizontal plane of the beam-shaped main part is formed at least in the region of the connecting means as an inclined surface for the angled guidance and receiving of connecting wires when the overvoltage protection device is arranged under a distributor cover.

The overvoltage protection arrangement according to the invention is arranged in a stackable manner.

In this respect, a closable opening is provided at the head part of the respective housing in the respective region of the printed circuit boards, which opening provides access to a printed circuit board section, in particular to a printed circuit board strip.

In the case of at least two adjoining overvoltage protection devices, a plug-in element can be attached by means of the openings, which element mechanically and/or electrically connects the respective devices.

The plug-in element is realised as a moulded part, which in each case has an extension which is adjusted to the opening contour and is complemented relative thereto.

The plug-in element itself may be conductive or may have a conductive portion to provide the desired electric connection, e.g. for a bus system. In this respect, the plug-in element can be implemented as an electric connection bridge.

In the region of their ends facing the housing base, the printed circuit boards are mechanically and electrically connected via a common contact element, wherein an electric connection to the top-hat rail for the purpose of establishing an earth connection can be produced via the common contact element.

The invention will be explained in more detail below by reference to exemplary embodiments and with the aid of the drawings, wherein.

Figure 5:
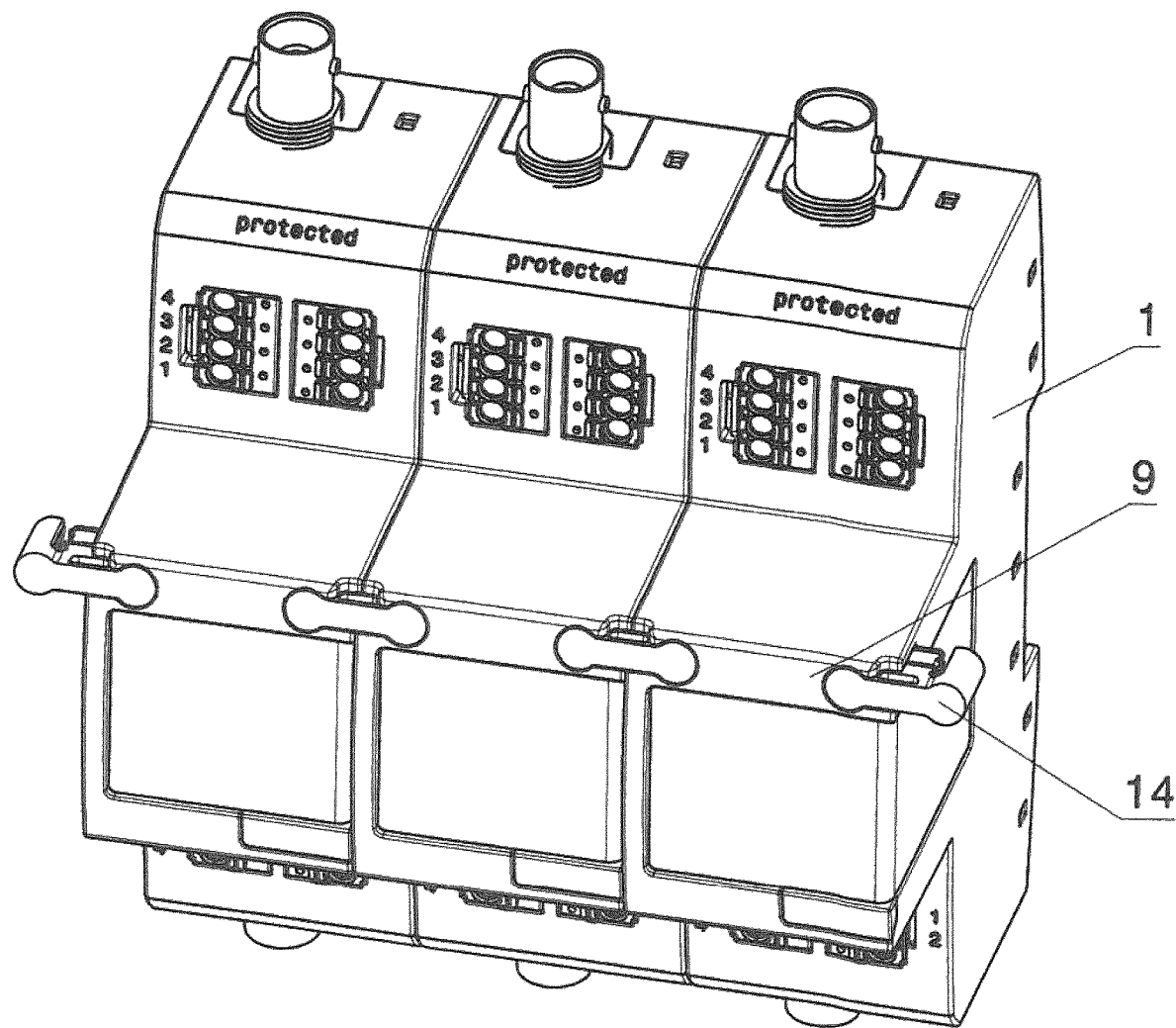
Figure 6:
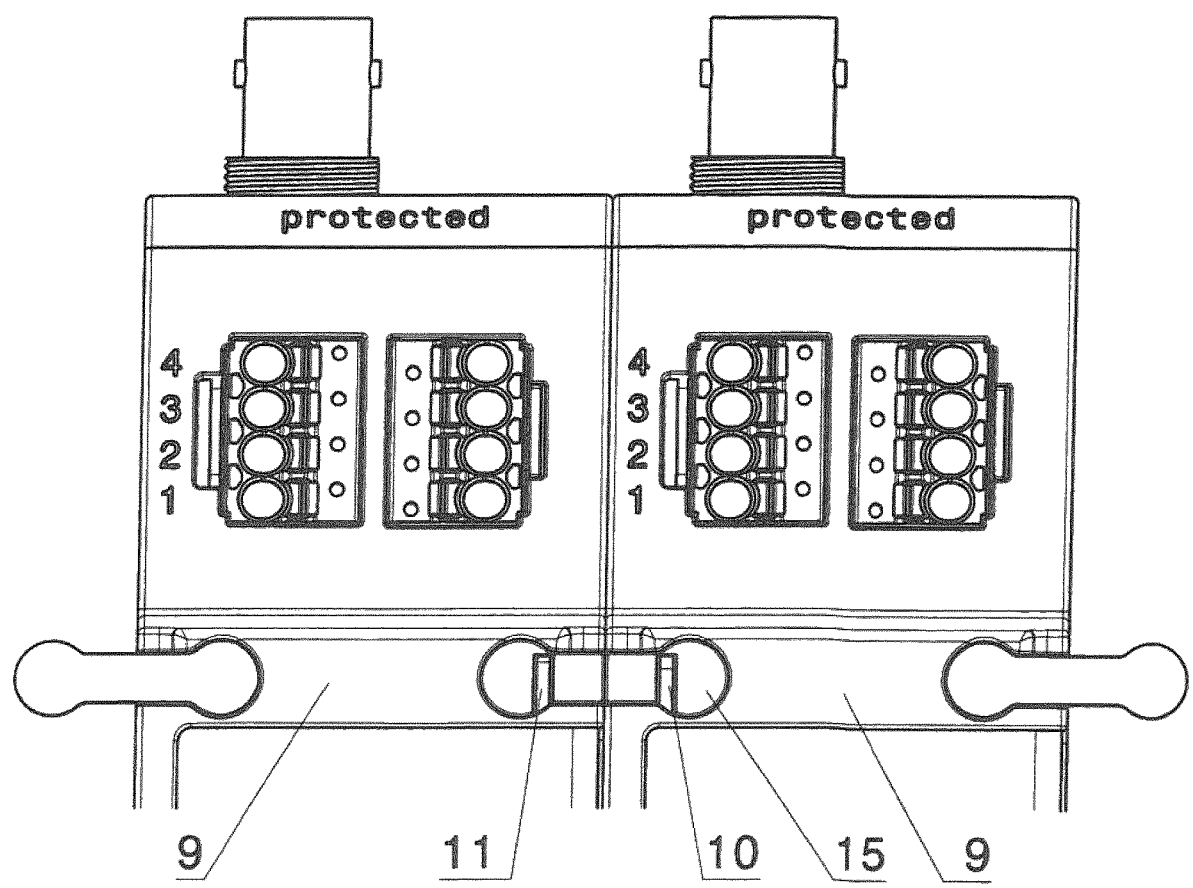
Figure 7:
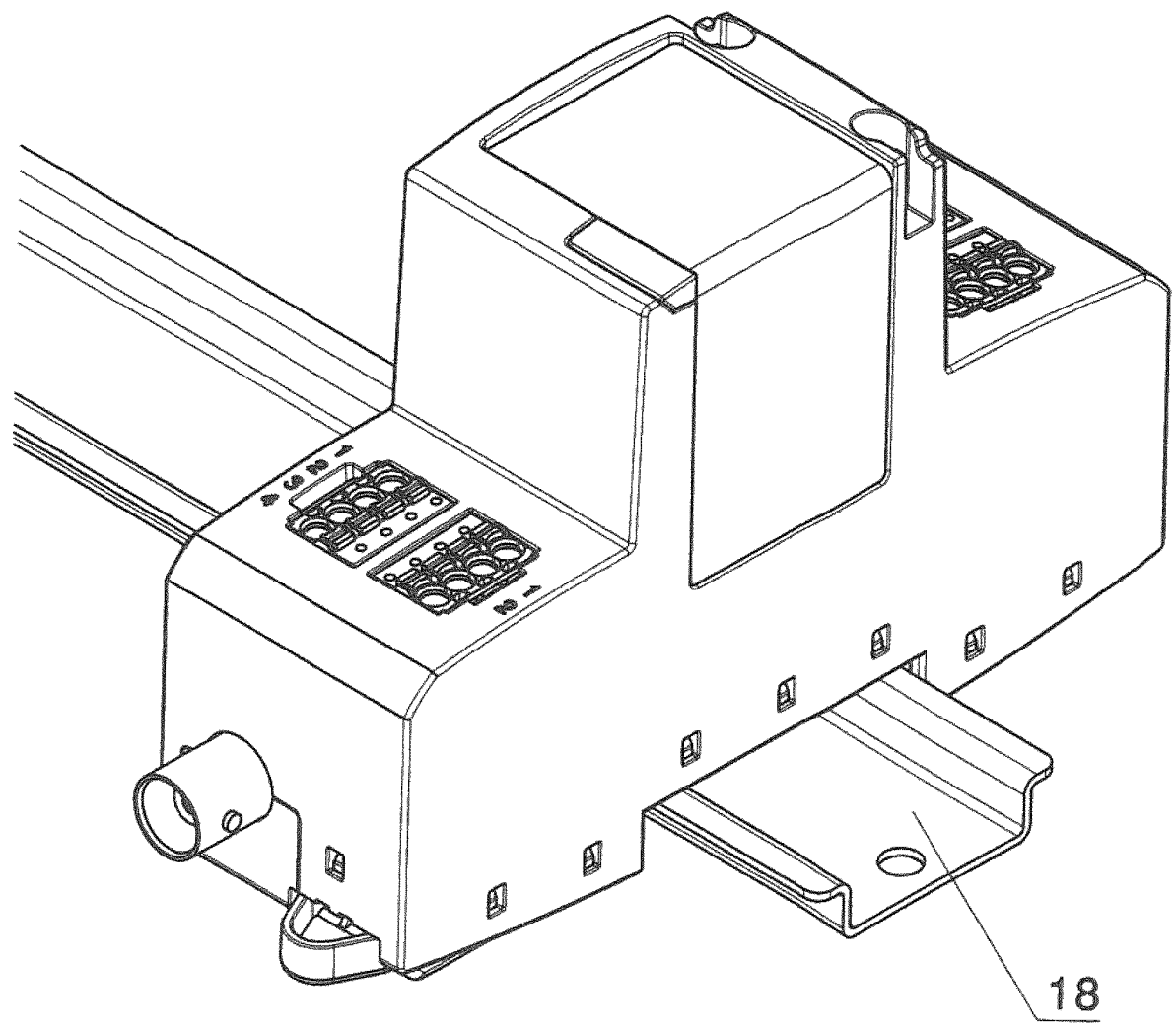
Figure 8:
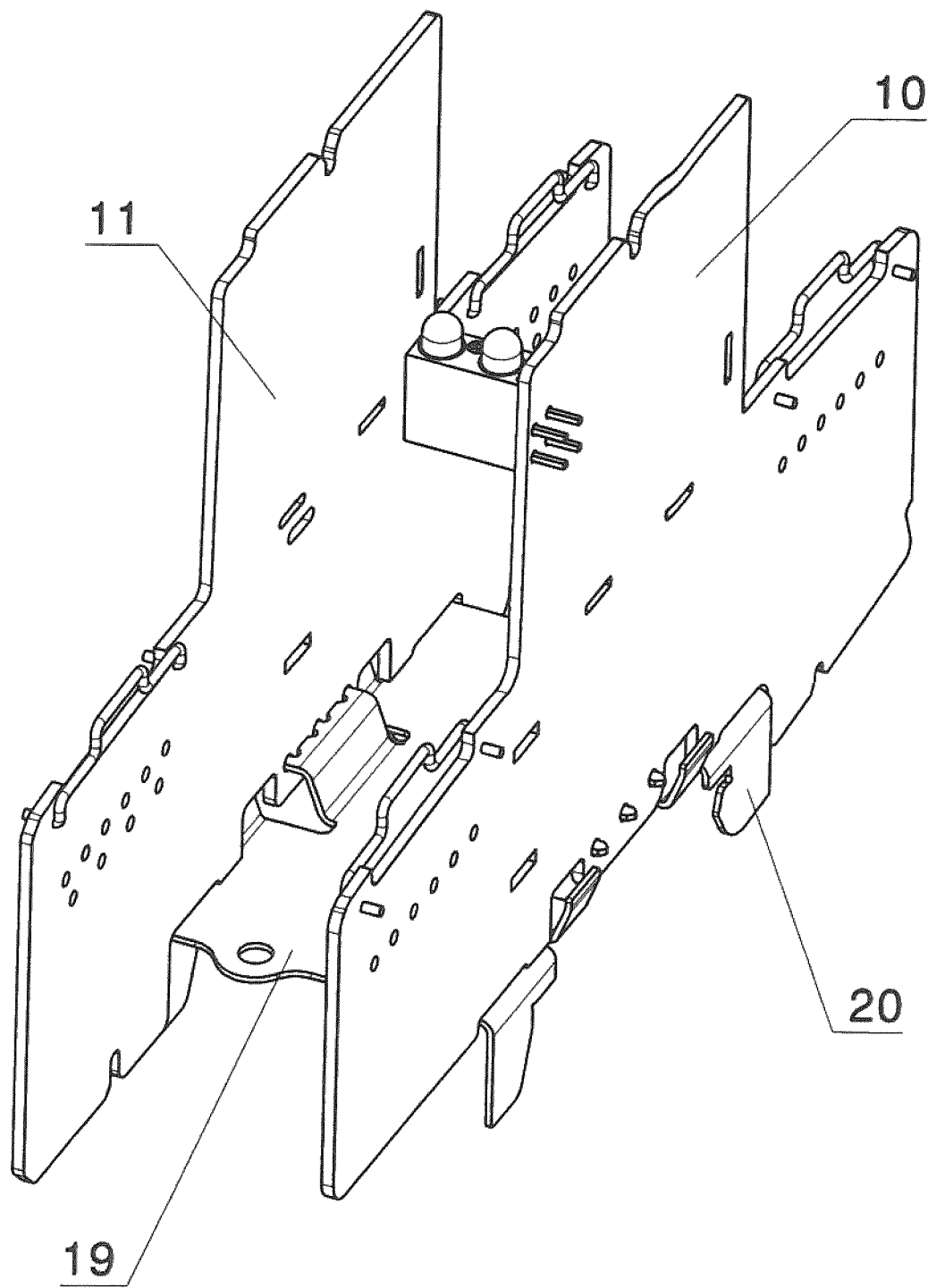

FIG. 5 sows a perspective view (top view) of three adjoining overvoltage protection arrangements, which are connected via plug-in elements;

FIG. 6 shows a detailed view of two adjoining overvoltage protection arrangements with a closable opening respectively disposed in the head part of the housing and a part of a respective circuit board which can be seen in the opening section;

FIG. 7 shows a perspective view of the arrangement of an overvoltage protection device on a top-hat rail with a partially broken-away housing, and FIG. 8 shows a detail view of the circuit boards with a common contact element.

According to the exemplary embodiment, an overvoltage protection arrangement is provided which has a housing having the shape of an upside-down T. The housing has a beam-shaped main part 1 and a protuberant head part 2.

Provided at the bottom of the beam-shaped main part 1 is a recess 3 for the purpose of the top-hat rail mounting of the overvoltage protection arrangement.

A first plane on the beam-shaped main part 1 is designated as a horizontal plane 4 and a second plane as a horizontal plane 5. Electric connection means 6 are accessible or arranged on the horizontal plane 4 as well as electric connection means 7 on the vertical plane 5.

In a preferred embodiment, the first connection means 6 are designed as terminals for the wire connection. The horizontal plane 4 is inclined, i.e. it is designed as an inclined surface, so that an optimal introduction of connecting lines is possible and the connecting lines are located under a distribution cover (not shown).

Figure 1:
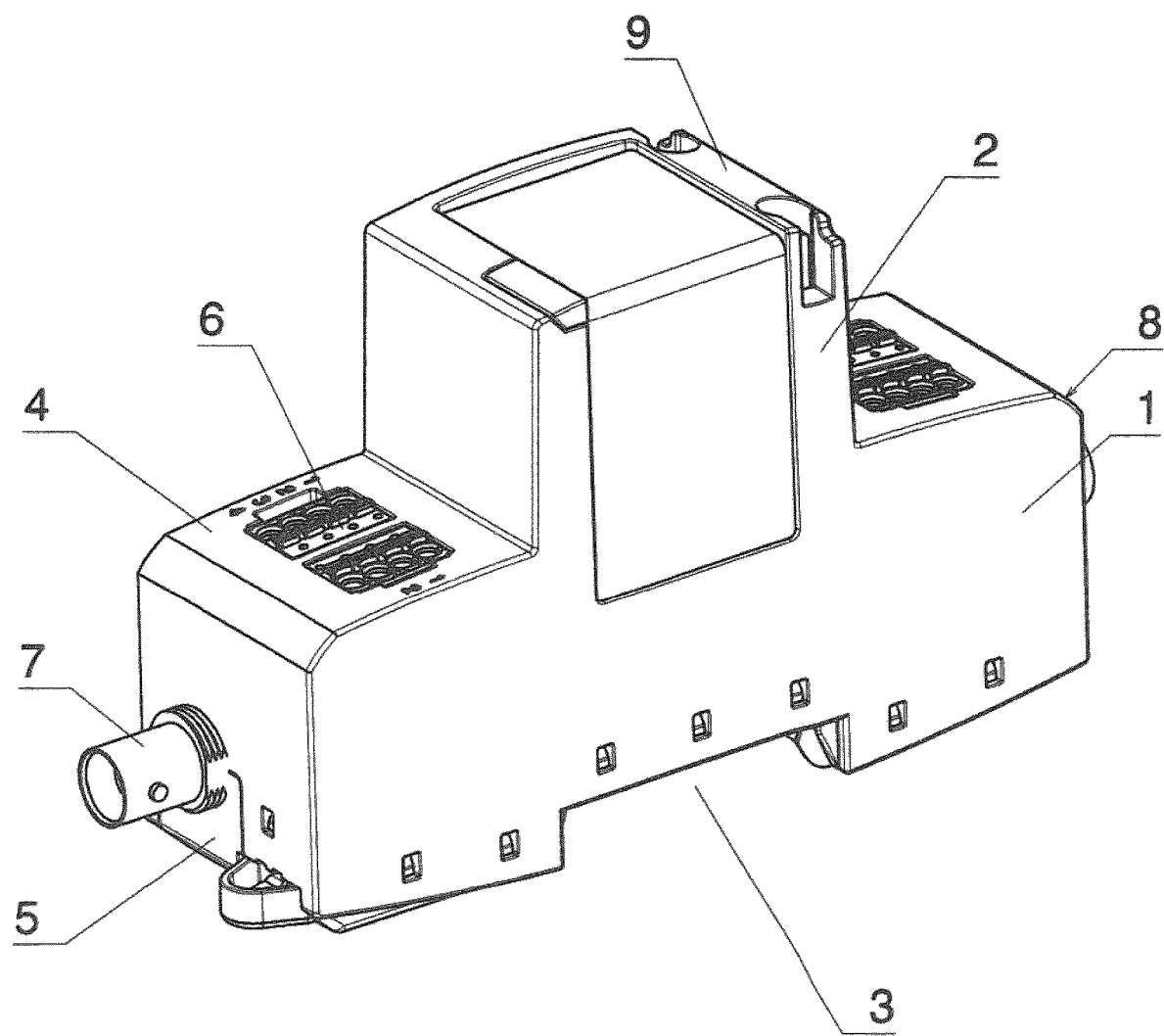
FIG. 1 shows a perspective view of the overvoltage protection arrangement with housing in the form of an inverted T.

Sockets or plugs can be arranged for example in the vertical plane 5 (plane 2). The illustration according to FIG. 1 shows a BNC socket as a connection means 7. Further embodiments may be provided as RJ sockets, sub-D plug sockets or the like.

The aforementioned inclined surface is symbolised in FIG. 1 by the reference numeral 8.

A further plane 9 (plane 3) is used for the arrangement of a terminal, which is described below, in alignment with the neighbouring device when a series of overvoltage protection arrangements is arranged side-by-side, for example, for the through connection of a bus/communication line for the data exchange between correspondingly adjacent devices.

Figure 2:
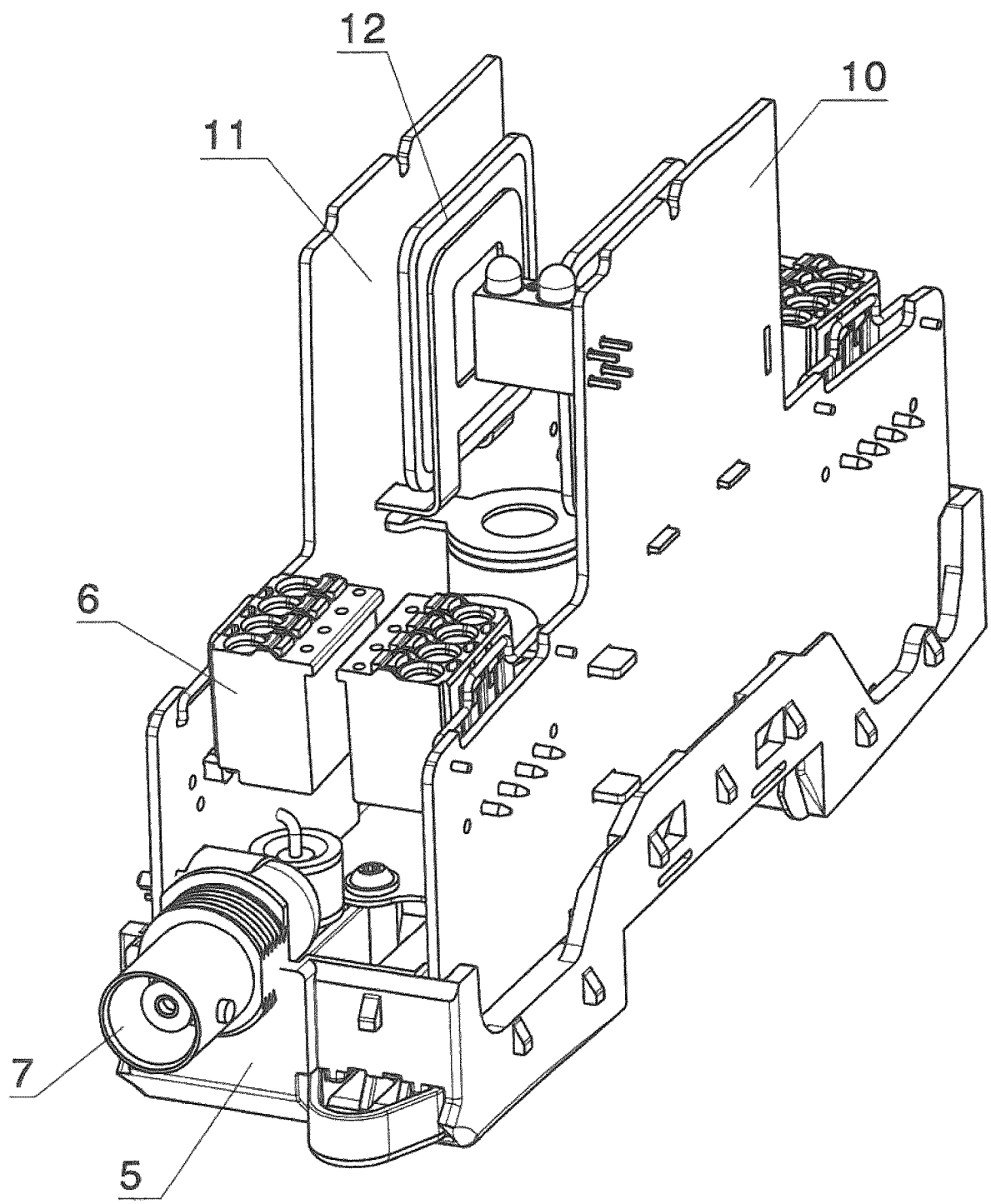
FIG. 2 shows a view similar to that of FIG. 1, but with a freely accessible view of the spaced-apart circuit boards which approximate the housing shape, together with connecting means.
Figure 3:
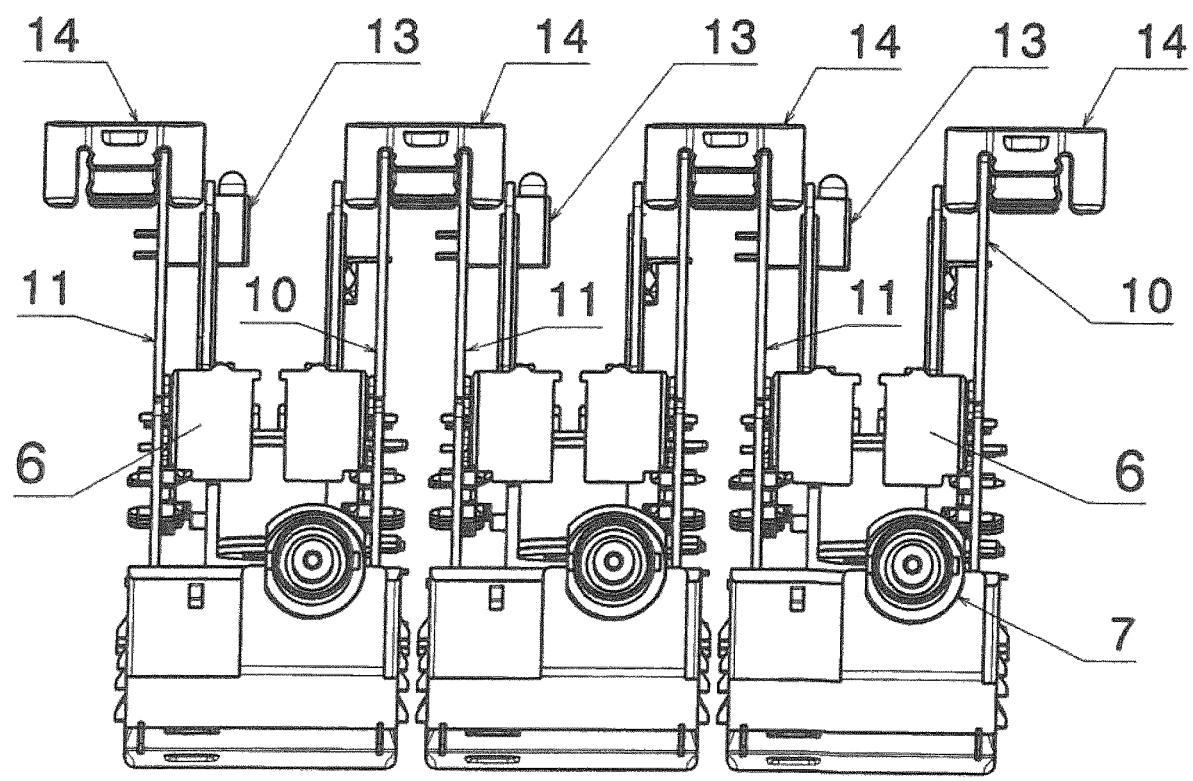
FIG. 3 shows a view of three adjoining overvoltage protection arrangements (omitting parts of the housing)

The illustrations according to FIGS. 2 and 3 show that within the housing two spaced-apart printed circuit boards 10 and 11 are arranged, which have a surface shape substantially corresponding to the longitudinal sectional area of the housing. In the space between the printed circuit boards 10 and 11, respective terminals 6, for example, are disposed for the wire connection or a plug/socket 7 for connecting a coaxial conductor. The printed circuit boards also carry the actual overvoltage protection elements 12, e.g. varistors, and serve to fix function indicators 13, which are formed as light-emitting diodes for example.

Figure 4:
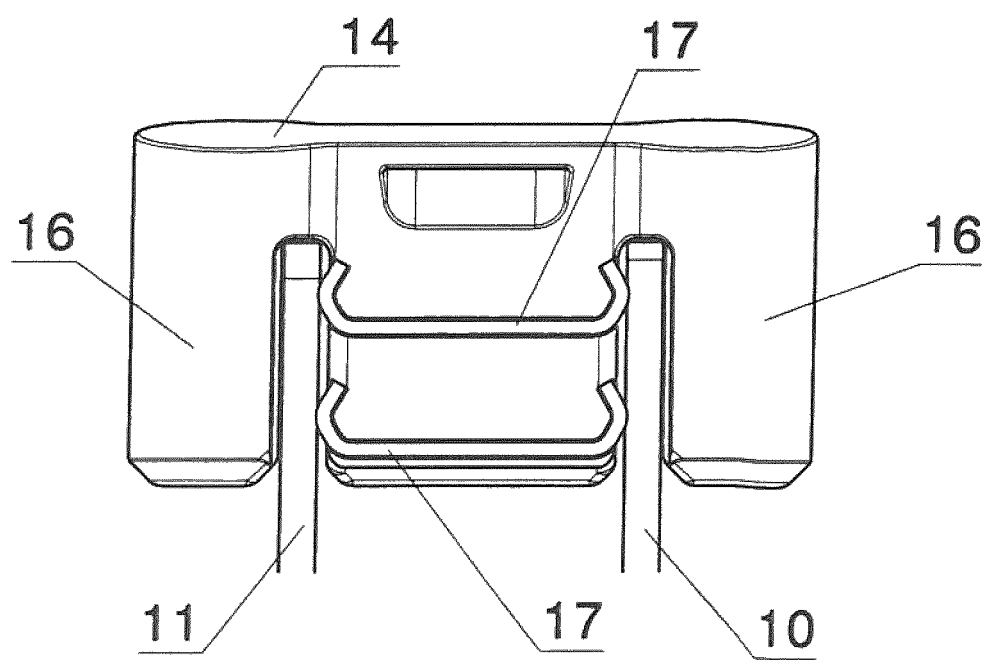
FIG. 4 shows an enlarged view of the connecting element, which is formed as a connecting bridge, which can already be seen in FIG. 3.

As can be seen from FIGS. 3 and 4, an electric connection between adjacent devices can be established by the arrangement of the printed circuit boards 10; 11 on the side of the respective housing inner wall via a printed circuit board plug connector 14 in order to realise data exchange or to also provide a power supply.

As can be seen in FIG. 4, the plug element 14 can be designed as a moulded part, which has extensions 16 adapted to the opening contour in opening 15 disposed in the head part 9 of the housing.

If, for example, the plug element 14 is provided with a conductive contour or a conductive section 17, the desired electric connection between the circuit boards 10 and 11 can be realised.

In the illustrated example, the plug element 14 consists of the two pin-shaped extensions 16, which are connected via a web. The respective opening 15 in the head part 9 of the corresponding housing is correspondingly adapted to this plug element contour.

The connector can thus be designed in such a way that, via the contour of the plug element and the complementary design as a housing contour, a mechanical latching between adjacent devices occurs at the same time. An improvement in the stability of the overall arrangement is thus achieved. After removal of the plug element or the corresponding plug elements 14, a corresponding device can be detached from the assembly. It is thus not necessary to disconnect wires or cables.

FIG. 7 shows an overvoltage protection arrangement according to the invention with a partially broken-away housing, arranged on a top-hat rail 18. For the purpose of contacting the top-hat rail, it is possible to mechanically connect the printed circuit boards 10; 11 via a contact element 19 and to contact them electrically.

In this respect, the aforementioned contact element 19 is provided in the lower part of the housing, which element connects the printed circuit boards 10 and 11 to the top-hat rail 18. In addition, with regard to this solution element, good mechanical strength of the printed circuit boards in the housing with seat on the top-hat rail 18 is achieved. The arrangement can be fixed in the housing lower part by means of detent elements 20 on the contact element 19.

The invention claimed is:

1. An overvoltage protection arrangement for information and telecommunication technology, consisting of a housing with means (3) formed on the housing base for top-hat rail mounting, overvoltage protection elements (12) disposed in the housing, electric connection means (6; 7) and at least one printed circuit board (10; 11) as a wiring support for the overvoltage protection elements (12), furthermore with a shape of the housing with a beam-shaped main part (1) and a protruding head part (2), characterized in that a first (10) and a second (11) printed circuit board are respectively spaced from one another on the inner sides of the side walls of the housing, wherein in the distance space the electric connection means (6; 7) are arranged in the form of electric connection terminals, connection sockets and/or plugs in such a way that the first connection means (6) are accessible in the horizontal (4) plane of the beam-shaped main part (1) and second connection means (7) in the vertical (5) plane thereof, and the surface shape of the printed circuit boards (10; 11) approximates the shape of the housing or corresponds to this shape;

characterized in that it is arranged in a stackable manner; and characterized in that a closable opening (15) is provided at the head part (2) of the housing respectively in the region of the printed circuit boards (10; 11), which opening provides access to a printed circuit board section.

2. An overvoltage protection arrangement according to claim 1, characterized in that in the case of at least two adjoining overvoltage protection devices, a plug-in element (14) is attached by means of the openings (15), which element mechanically and/or electrically connects the respective devices.

3. An overvoltage protection arrangement according to claim 2, characterized in that the plug-in element (14) is realised as a moulded part, which comprises extensions (16) which are adjusted to the opening contour and are complemented relative thereto.

4. An overvoltage protection arrangement according to claim 2, characterized in that the plug-in element (14) is conductive or comprises a conductive section (17).

5. An overvoltage protection arrangement according to claim 2, characterized in that the plug-in element (14) is formed as an electric connection bridge.

\* \* \* \* \*